United States Patent
Akhtar et al.

(10) Patent No.: US 11,646,700 B2
(45) Date of Patent: May 9, 2023

(54) AMPLIFIERS WITH FEEDFORWARD CANCELLATION

(71) Applicant: TEXAS INSTRUMENTS INCORPORATED, Dallas, TX (US)

(72) Inventors: Siraj Akhtar, Richardson, TX (US); Swaminathan Sankaran, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 5 days.

(21) Appl. No.: 17/353,214

(22) Filed: Jun. 21, 2021

(65) Prior Publication Data
US 2022/0407471 A1    Dec. 22, 2022

(51) Int. Cl.
*H03F 1/32* (2006.01)
*H03F 3/45* (2006.01)

(52) U.S. Cl.
CPC ......... *H03F 1/3223* (2013.01); *H03F 1/3205* (2013.01); *H03F 2200/387* (2013.01)

(58) Field of Classification Search
CPC . H03F 1/3223; H03F 1/3205; H03F 2200/387
USPC ................. 330/136, 151, 252–261
See application file for complete search history.

(56) References Cited

U.S. PATENT DOCUMENTS

| | | | |
|---|---|---|---|
| 8,421,541 B2* | 4/2013 | Sengupta | H03F 3/45188 327/359 |
| 8,604,879 B2* | 12/2013 | Mourant | H03F 1/34 330/292 |
| 2005/0258901 A1 | 11/2005 | Khorramabadi | |
| 2012/0306576 A1 | 12/2012 | Paidi Vamsi et al. | |

OTHER PUBLICATIONS

James Karki, "Fully-Differential Amplifiers"; AAP Precision Analog; Texas Instruments, Application Report SLOA054E—Jan. 2002—Revised Sep. 2016; 28 pgs.

* cited by examiner

*Primary Examiner* — Hieu P Nguyen
(74) *Attorney, Agent, or Firm* — Ray A. King; Frank D. Cimino

(57) ABSTRACT

A circuit includes a main amplifier having a first input and a first output. A main bias circuit is coupled to the main amplifier, and the main bias circuit configured to operate the main amplifier in a first frequency band. A feedforward cancellation amplifier has a second input and a second output, in which the second input is coupled to the first input, and the second output is coupled to the first output. A filter is coupled between the first input and the second input. A feedforward bias circuit is coupled to the feedforward cancellation amplifier. The feedforward bias circuit is configured to operate the feedforward cancellation amplifier in a second frequency band within and narrower than the first frequency band.

22 Claims, 5 Drawing Sheets

AMPLIFIERS WITH FEEDFORWARD CANCELLATION

TECHNICAL FIELD

This description relates generally to amplifiers with feedforward cancellation.

BACKGROUND

Power amplifiers are widely used to amplify signals for a variety of purposes. For broadband operation, amplifiers are configured to process signal content simultaneously across a wide range of frequencies. However, many amplifier designs include nonlinear circuitry, such as transistors. The nonlinear circuitry of an amplifier can produce intermodulation distortion when broadband signals interact with the nonlinear circuitry.

SUMMARY

In a described example, a circuit includes a main amplifier having a first input and a first output. A main bias circuit is coupled to the main amplifier, and the main bias circuit configured to operate the main amplifier in a first frequency band. A feedforward cancellation amplifier has a second input and a second output, in which the second input is coupled to the first input, and the second output is coupled to the first output. A filter is coupled between the first input and the second input. A feedforward bias circuit is coupled to the feedforward cancellation amplifier. The feedforward bias circuit is configured to operate the feedforward cancellation amplifier in a second frequency band within and narrower than the first frequency band.

In another described example, a circuit includes a main differential amplifier and a feedforward cancellation circuit. The main differential amplifier has a first differential input and a first differential output. The feedforward cancellation circuit includes a first differential feedforward amplifier and a second differential feedforward amplifier. The first differential feedforward amplifier has a second differential input and a second differential output. The second differential input is coupled to the first differential input, and the second differential output is cross-coupled to the first differential output. The first differential feedforward amplifier is configured to reduce intermodulation distortion at the first differential output in a first frequency band. The second differential feedforward amplifier has a third differential input and a third differential output. The third differential input is coupled to the first differential input, and the third differential output cross-coupled to the first differential output. The second differential feedforward amplifier is configured to reduce intermodulation distortion at the first differential output in a second frequency band different from the first frequency band.

In another described example, a circuit includes a main broadband non-linear amplifier having a first input and a first output. A first feedforward non-linear amplifier has a second input and a second output. The second input is coupled to the first input, and the second output is coupled to the first output. A first filter is coupled between the first and second inputs. A second feedforward non-linear amplifier has a third input and a third output. The third input is coupled to the first input and the third output is coupled to the first output. A second filter is coupled between the first and third inputs.

DETAILED DESCRIPTION

Figure 1:
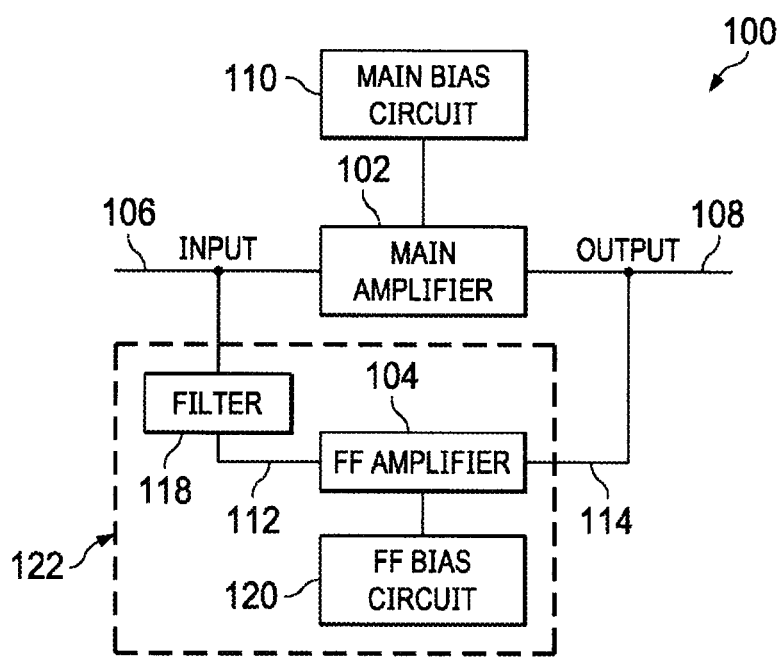
FIG. 1 is a block diagram of an example amplifier having feedforward cancellation.

This description relates to using feedforward amplifiers to reduce intermodulation distortion in amplifiers. For example, a main amplifier has an input and an output. The main amplifier input is configured to amplify an input signal that is provided at the input. In an example, the input signal is broadband signal, and the main amplifier is configured to amplify the broadband signal. As used herein, including in terms of signals or operating frequency, the term broadband refers a wide frequency range or bandwidth, such as from DC to 1 GHz, 10 GHz, 100 GHz or even higher. For example, a broadband signal can include signals or signal components over such a wide frequency range. As another example, a broadband amplifier is configured to simultaneously amplify signal content at any arbitrary number of frequencies or frequency bands.

A feedforward cancellation circuit includes a feedforward amplifier having an input and output, in which the input is coupled to the input of the main amplifier and the output is coupled to the output of the main amplifier. The feedforward cancellation amplifier is configured to operate in one or more frequency bands, which are narrower than the main amplifier. For example, each of the main amplifier and the feedforward cancellation amplifiers is a differential amplifier that includes respective transistors, in which differential outputs of the feedforward cancellation amplifier are cross-coupled to respective differential outputs of the main amplifier. Thus, the feedforward cancellation amplifier is configured to reduce intermodulation distortion at the output of the main amplifier.

In another example, the circuit includes multiple feedforward cancellation amplifiers coupled to the main amplifier. The respective feedforward cancellation amplifiers are configured to generate distortion in different frequency bands that are within and narrower than the frequency range (e.g., broadband range) of the main amplifier. The generated distortion is then subtracted from distortion generated by the main amplifier, such as through cross coupling at the differential output. The feedforward cancellation amplifiers thus can be configured as amplifiers tuned to operate in respective frequency bands distributed across the broadband frequency range of the main amplifier. Because the signal amplification of the feedforward cancellation amplifiers is much lower than the main amplifier, when the cancellation signal is subtracted from the main amplifier signal, the resulting signal loss is low but distortion reduces significantly. As a result, the feedforward cancellation amplifiers can be configured to reduce intermodulation distortion over broadband so the amplified output signals provided by the main amplifier can exhibit improved broadband linearity. Additionally, because the feedforward amplifiers are configured as distributed feedforward cancellation amplifiers, which collectively consume a relatively small amount of power compared to the main amplifier, the circuit can operate with improved power efficiency and with at least comparable linearity relative to many existing amplifier designs where high power is consumed to achieve linearity.

As used herein, the term "circuit" can include a collection of active and/or passive elements that perform an electronic circuit function, such as an analog circuit and/or digital circuit. Additionally or alternatively, for example, the term "circuit" can include an integrated circuit (IC) where all or some of the circuit elements are fabricated on a common substrate (e.g., semiconductor substrate, such as a die or chip) or within a common package herein. For example, a wide bandwidth amplifier circuit, which includes the main amplifier and the feedforward cancellation amplifiers, is implemented as an IC on a respective semiconductor substrate. By implementing these and other components of the amplifier circuit on the IC, parasitic circuit features (e.g., parasitic capacitance and/or parasitic inductance) can be reduced, allowing improved bandwidth.

FIG. 1 is a block diagram of a circuit 100 including a main amplifier 102 and one or more feedforward amplifiers 104. The main amplifier 102 has an input 106 and an output 108. For example, the main amplifier 102 is configured to amplify an input signal received at the input 106 and provide a respective output signal at the output 108. The output signal at 108 is an amplified version of the input signal received at 108. A main bias circuit 110 is coupled to the main amplifier and configured to operate the main amplifier over a range of frequencies. For example, the main amplifier 102 is configured to operate over a wide range of frequencies (e.g., for broadband amplification, such as over tens or hundreds of GHz) responsive to a bias signal provided by the bias circuit 110. For example, the bias circuit 110 is configured to supply a bias current (e.g., a DC bias current) to bias the main amplifier 102 for broadband operation. Because the main amplifier 102 is implemented using one or more nonlinear components, including transistors (e.g., bipolar junction transistors, field effect transistors and/or other transistor types), the amplifier 102 will introduce intermodulation distortion in the output signal. The intermodulation distortion thus reduces the linearity of the amplifier 102.

The feedforward amplifier 104 has an input 112 and an output 114. The input 112 is coupled to the input 106 and the output 114 is coupled to the output 108. The feedforward amplifier 104 thus can be configured to provide low amplification (or even attenuation) to the input signal provided at 112, while generating a high level of distortion, and provide an output signal at the output 108, which is subtracted from the output generated by the amplifier 102. For example, the feedforward amplifier 104 is implemented using transistors that are fractionally scaled replicas of transistors implemented in the main amplifier 102. In an example, a ratio between the size of feedforward amplifier transistors and a size of respective main amplifier transistors is less than or equal to about 25%, such as 10% or other ratio. The smaller transistors in the feedforward amplifier 104 thus are configured to consume less power than the larger matching transistors in main amplifier 102. Also, the smaller transistors in the amplifier 104 and low current bias results in a high level of distortion and small signal (e.g., even attenuates the input signal) at the output. The output of the amplifier 104 is subtracted from the main amplifier output. The subtraction may cause a small reduction the gain of the main amplifier but provides a much larger reduction in the intermodulation distortion at the output.

As shown in FIG. 1, a filter 118 is coupled between the respective inputs 106 and 112. The filter 118 is configured to control one or more frequency bands that are passed from the input 106 of the main amplifier to the input 112 of the feedforward amplifier 104. In an example, the filter 118 is implemented as a passive filter that includes a resistor, a capacitor, an inductor, a transmission line, or any combination of two or more such passive components. For example, the filter 118 is configured with a transfer function to implement as a low-pass filter, a high-pass filter, a notch filter, a band-pass filter or other filter configuration or any combination of filter functions having a transfer function designed to pass one or more respective frequency bands to the input 112. In an example, the filter 118 is configured (e.g., as an arrangement of one or more hardware components) to perform filter function over a fixed one or more frequency bands. In another example, the filter 118 is configurable (e.g., responsive to a register value) to implement a transfer function in which one or more frequency bands are passed to the input 112 of the feedforward amplifier 104.

A feedforward bias circuit 120 is also coupled to the feedforward amplifier 104 and configured to control the amount of distortion generated by the feedforward amplifier in a frequency band. The frequency band of the feedforward amplifier 104, which can be set by the filter 118, is narrower than the frequency band implemented by the main amplifier 102. The frequency band also resides within the broadband frequency range in which the main amplifier 102 is configured to operate. For example, the bias circuit 120 is configured to supply a bias current (e.g., a DC bias current) to bias the feedforward amplifier 114 to generate narrow band distortion, which is subtracted from the output of the main amplifier 102. In an example, the bias circuit 120 and filter 118 are configured to work together to create band-specific distortion, which is then subtracted from the main amplifier output to reduce distortion accordingly. However, even in the absence of the filter 118, the feedforward amplifier 104 and bias circuit 120 are configured to generate distortion in a narrow-band because of its small size and low bias current compared to the main amplifier 102.

In an example, the main amplifier 102 is implemented as a differential amplifier, in which the input 106 is a differential input and output 108 is a differential output. Also, the feedforward amplifier 104 is implemented as a differential amplifier having differential inputs coupled to respective differential inputs of the main amplifier. As described herein, each differential input and differential output has a pair of respective terminals, which terminals may also be referred to as differential inputs and differential outputs. The differential outputs of the feedforward amplifier 104 are cross-coupled to respective differential outputs of the main amplifier 102. Because the differential outputs of the main amplifier 102 are out of phase (e.g., about 180° phase shift), the cross-coupling provides cancellation signals to subtract intermodulation distortion provided at differential outputs of the feedforward amplifier 104 from the amplified output signals of the main amplifier 102. In an example embodiment of the circuit 100 in which the amplifiers 102 and 104 are not differential amplifiers, the circuit 100 includes other circuitry (not shown) configured to invert or implement a suitable phase shift on the output signal provided at the output 114 of the feedforward amplifier 104 so the output signal at 114 is operative to reduce or cancel intermodulation distortion from the amplified output signal provided by the main amplifier 102 at 108. This phase shifting can be performed by a combination of passive components such as inductors, capacitors and/or transmission lines.

In another example, the circuit 100 includes more than one instance of feedforward cancellation circuitry 122. Each instance of the cancellation circuitry 122 can be configured as shown in FIG. 1. In an example, a given instance of cancellation circuitry 122 includes a filter 118 coupled between the input 106 and an input 112 of the respective feedforward amplifier 104. A respective feedforward bias circuit 120 is coupled to the respective feedforward amplifier 104, and configured to set the appropriate distortion (e.g., band limited by the filter 118) of the feedforward amplifier 104. Each instance of the cancellation circuitry 122 thus is configured to operate over a different frequency range residing within the operating frequency range (e.g., broadband frequency range) of the main amplifier 102. The filter 118 is configured to pass a filtered input signal within one or more frequency bands to the input of the feedforward amplifier. The feedforward amplifier 104 is configured to provide a respective distortion cancellation signal to the output 108 of the main amplifier responsive to the filtered input signal at 112 and according to the operating frequency band of the respective feedforward amplifier, with the level of distortion set by the respective bias circuit 120. As a result, the one or more instances of cancellation circuitry 122 are configured to reduce wideband distortion in the amplified output signal provided at output 108 by the main amplifier 102. Also, a plurality of feedforward cancellation circuits 122 can be implemented in which all feedforward cancellations circuits are driven in parallel from the same input 106. Alternatively, feedforward cancellation circuits can be cascaded by coupling them in series so one cancellation circuit drives a next cancellation circuit in the series.

As a further example, the circuit 100 is implemented as an IC on a semiconductor substrate. Thus, the IC can include the main amplifier 102, the main bias circuit 110 as well as the cancellation circuitry 122 (feedforward amplifier 104, filter 118 and feedforward bias circuit 120). By implementing the circuit components on an IC, parasitic capacitance and/or inductance can be reduced, which helps to increase bandwidth and linearity.

Figure 2:
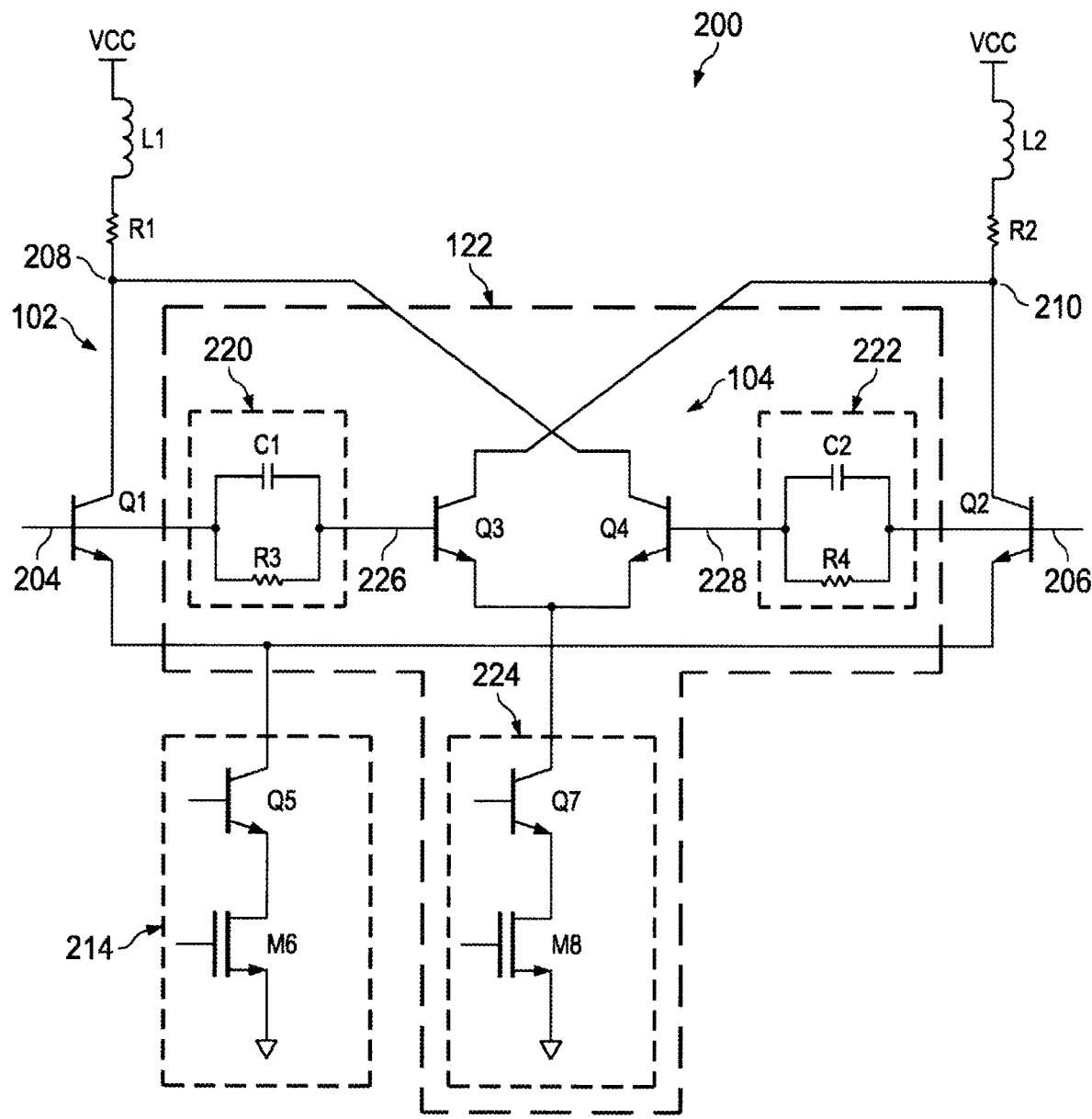
FIG. 2 is a circuit diagram showing an example amplifier having feedforward cancellation.

FIG. 2 is a circuit diagram showing an example amplifier circuit 200. The circuit 200 shows an example of circuit components that can be used to implement the circuit 100 of FIG. 1. Accordingly, the description of FIG. 2 also refers to FIG. 1. The circuit 200 includes a main amplifier 102 configured as a differential amplifier having differential inputs 204 and 206 and differential outputs 208 and 210.

In the example of FIG. 2, the main amplifier 102 includes transistors Q1 and Q2. In examples disclosed herein, the amplifier transistors are shown as NPN bipolar junction transistors (BJT) operating in a common emitter configuration with a bottom tail current source. In other examples different types of transistors could be used such as metal oxide semiconductor field effect transistors (MOSFETs), junction field effect transistors (JFETs), insulated-gate bipolar transistors (IGBTs) or other types of transistors either N type or P type configured as common base or common collector with top or bottom tail currents. The input 204 is coupled to the base of Q1 and the collector of Q1 is coupled to the output 208. The output 208 is adapted to be coupled to a voltage source (not shown) that provides a supply voltage shown as VCC. Similarly, differential input 206 is coupled to the base of Q2, and the collector of Q2 is coupled to the output of 210. The output 210 is adapted to be coupled to a voltage source configured to provide the supply voltage VCC. In the example of FIG. 2, the outputs 208 and 210 are coupled to VCC through series connected resistor and inductor, shown as R1, L1 and R2, L2, which form the load of the amplifier The emitters of Q1 and Q2 are coupled together, and a bias circuit 214 has an output coupled to the emitters. The bias circuit 214 is coupled between the emitters of Q1 and Q2 and a second supply voltage, shown as ground. In the example of FIG. 2, the bias circuit 214 includes a BJT Q5 coupled in series with MOSFET M6 between the emitters of Q1 and Q2 and ground. The bias circuit 214 can be configured to operate as a current source to provide a DC current bias that can adapt over temperature and can be implemented using varying transistor types and combinations (e.g., BJTs and/or MOSFETs). In other examples, different circuitry can be utilized to bias the main amplifier 102.

The circuit 200 also includes a feedforward cancellation circuitry 122. The feedforward cancellation circuitry 122 includes a feedforward amplifier 104, filters 220 and 222 and a bias circuit 224. As described herein, there can be any number of one or more instances of the feedforward cancellation circuitry 122, in which each instance is configured to reduce output distortion from the main amplifier 102 in a respective frequency band to collectively achieve wideband distortion cancellation.

The feedforward amplifier 104 is an example of the feedforward amplifier 104 of FIG. 1 implemented as a differential amplifier. For example, feedforward amplifier 104 is a scaled replica of the main amplifier 102 configured to consume less power than the main amplifier. As shown, the feedforward amplifier 104 includes BJTs Q3 and Q4 coupled in a common emitter configuration with bottom tail current bias circuit 224. The base of Q3 is coupled to the input 204 and the base of Q4 is coupled to the input 206. The collectors of Q3 and Q4 are configured as outputs of the feedforward amplifier 104. The feedforward amplifier 104 is cross-coupled to the main amplifier 202, in which the collector of Q3 is coupled to the output of 210 and the collector of Q4 is coupled to the output of 208. The cross coupling allows for the output of the feedforward amplifier to be subtracted from the output of the main amplifier.

The filter 220 is coupled between the base of Q3 and the input 204. Similarly, filter 222 is coupled between the base of Q4 and the input 206. Each filter 220, 222 is configured to pass one or more frequency bands from the respective input 204, 206 to the base of Q3 and Q4, respectively. In an example, the filters 220, 222 are identical and configured to implement the same transfer function, namely to pass the same frequency bands from the respective inputs 204 and 206 to the bases of Q3 and Q4. For example, the filter 220, 222 are implemented as passive filters including an arrangement of one or more resistors, capacitors, inductors and transmission lines.

In the example of FIG. 2, filter 220 is shown as an RC network that includes resistor R3 and capacitor C1 coupled in parallel between inputs 204 and 226. Similarly, filter 222 is shown as an RC network of resistor R4 and capacitor C2 coupled in parallel between inputs 206 and 228. For example, the filters 220 and 222 are configured as a high pass filters to limit low frequency content from being input to the feedforward amplifier 104. The resistors R3 and R4 allow for biasing of Q3 and Q4 as well as sets a low frequency attenuation of signals supplied to the feedforward amplifier 104. Because of such high-pass filtering (e.g., by filters 220 and 222), low frequency signals are not passed to inputs 226 and 228 (e.g., bases of Q3 and Q4) and thus not amplified by feedforward amplifier 104. The low frequency signals are provided as inputs 204 and 206 (e.g., bases of Q1 and Q2), such that low frequency signals rely on the native linearity of the main amplifier 202 without being negatively impacted by the non-linearity of the feedforward amplifier 104. High frequency signal components above the cutoff frequency of respective filters 220 and 222 thus are passed to inputs 226 and 228 of respective feedforward amplifier 104 so the feedforward cancellation can improve the high frequency linearity of the circuit 200 through the cross coupling described above. While the filters 220 and 222 are shown as RC networks configured as high pass filters, respective filters could be implemented by other types of filters and to pass one or more frequency bands according to application requirements for the circuit 200.

The feedforward bias circuit 224 is coupled to the emitters of Q3 and Q4, and is configured to bias the feedforward amplifier 104 for operation in a respective frequency range, (e.g., by generating distortion in the respective frequency range). For example, the feedforward bias circuit 224 is configured to bias the feedforward amplifier to have a frequency response for implementing distortion cancellation over the respective frequency range, which is narrower than the main amplifier 102. The bias circuit 224 can be configured similarly to the bias circuit 214. For example, bias circuit 224 includes BJT Q7 coupled in series with MOSFET M8 between emitters of Q3 and Q4 (which are coupled together) and the second supply voltage shown as ground.

The circuit 200 can be implemented on a semiconductor substrate of an IC. For example, the IC includes the main amplifier 102, the main bias circuit 110 as well as the cancellation circuitry 122. In the example of FIG. 2, the load L1, R1 as well as L2, R2 can also be implemented on the IC. In another example, L1, R1, L2 and R2 could be external components (off chip). Additionally, the source configured to supply VCC can be implemented either on chip or off chip.

Figure 3:
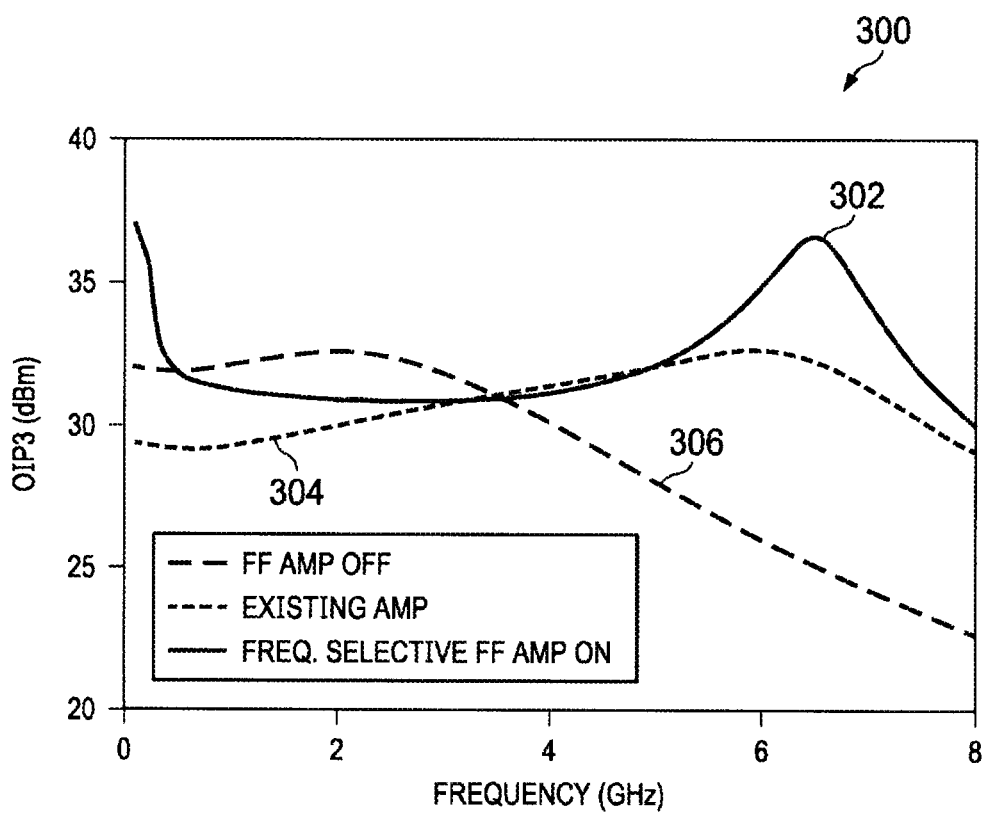
FIG. 3 is a graph showing a comparison of intermodulation distortion over frequency for different amplifier designs.

FIG. 3 is a graph 300 depicting output intermodulation distortion (OIP3) over a range of frequencies. The higher the OIP3 of an amplifier, the lower the intermodulation distortion of the amplifier is. The graph 300 includes a first plot 302 showing OIP3 for the circuit 200 of FIG. 2 compared to another plot 304 showing OIP3 for an existing amplifier (e.g., an amplifier with non-frequency selective feedforward cancellation), which does not include the frequency selective feedforward cancellation. The graph 300 also includes another plot 306 showing OIP3 for the circuit 200 in which the feedforward cancellation circuit 122 has been turned off (e.g., representing native main amplifier OIP3). As shown in FIG. 3, the plot 302 exhibits significantly improved performance at low frequencies and high frequencies with satisfactory performance between the low and high frequency regions compared to the plot 304 for the prior art differential amplifier. Plot 302 shows a slight compromise in performance around 2 GHz compared to plot 306 when the feedforward cancellation circuit 122 is turned off. However, the performance shown by plot 306 rapidly declines at higher frequency above about 4 GHz. As described herein, the performance of the amplifier can be tuned according to the application requirements by requiring additional instances of the feedforward cancellation circuit to exhibit improved OIP3 performance at multiple selected frequency ranges.

Figure 4:
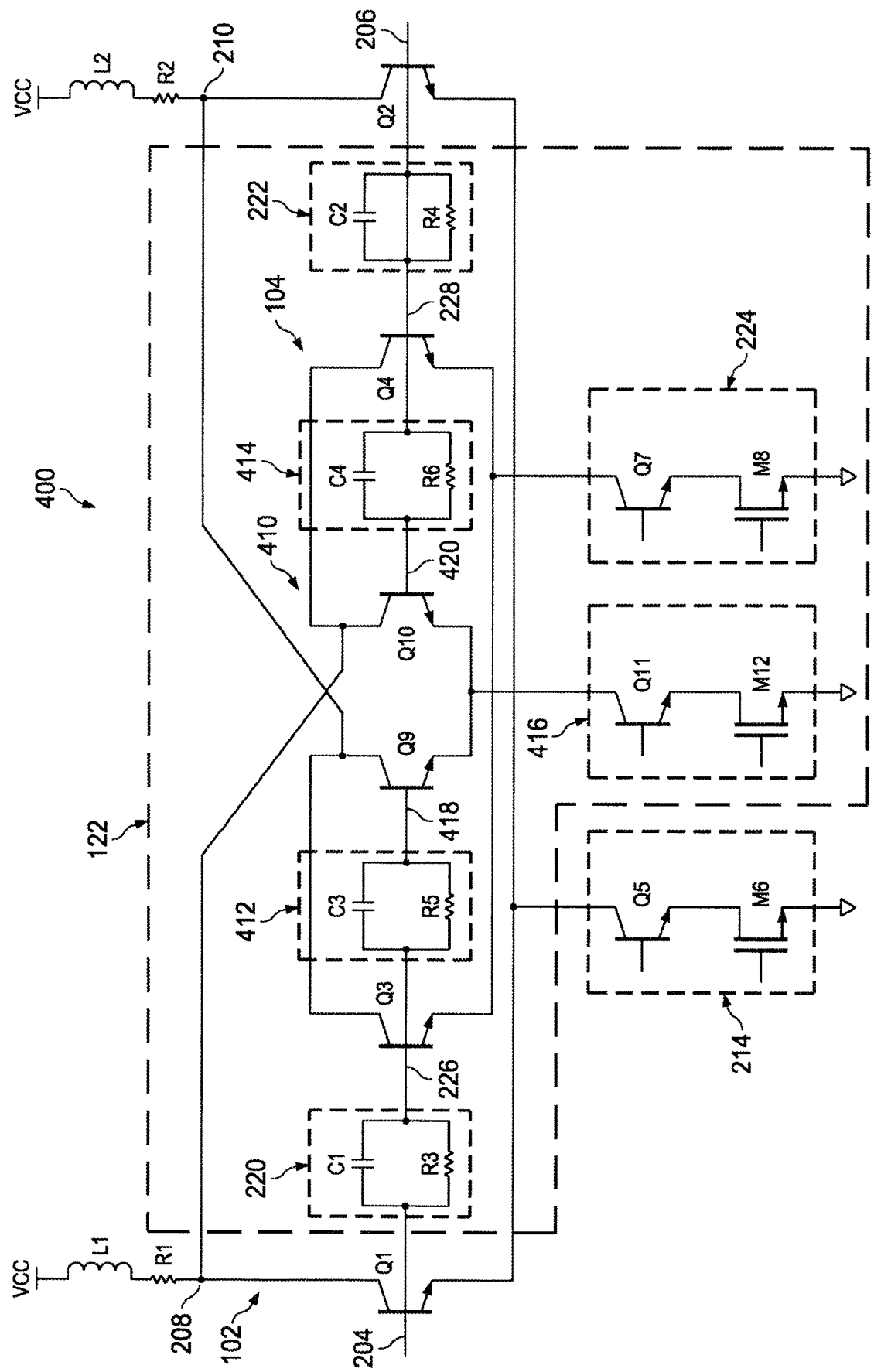
FIG. 4 is a circuit diagram showing an example amplifier having distributed feedforward cancellation.
Figure 5:
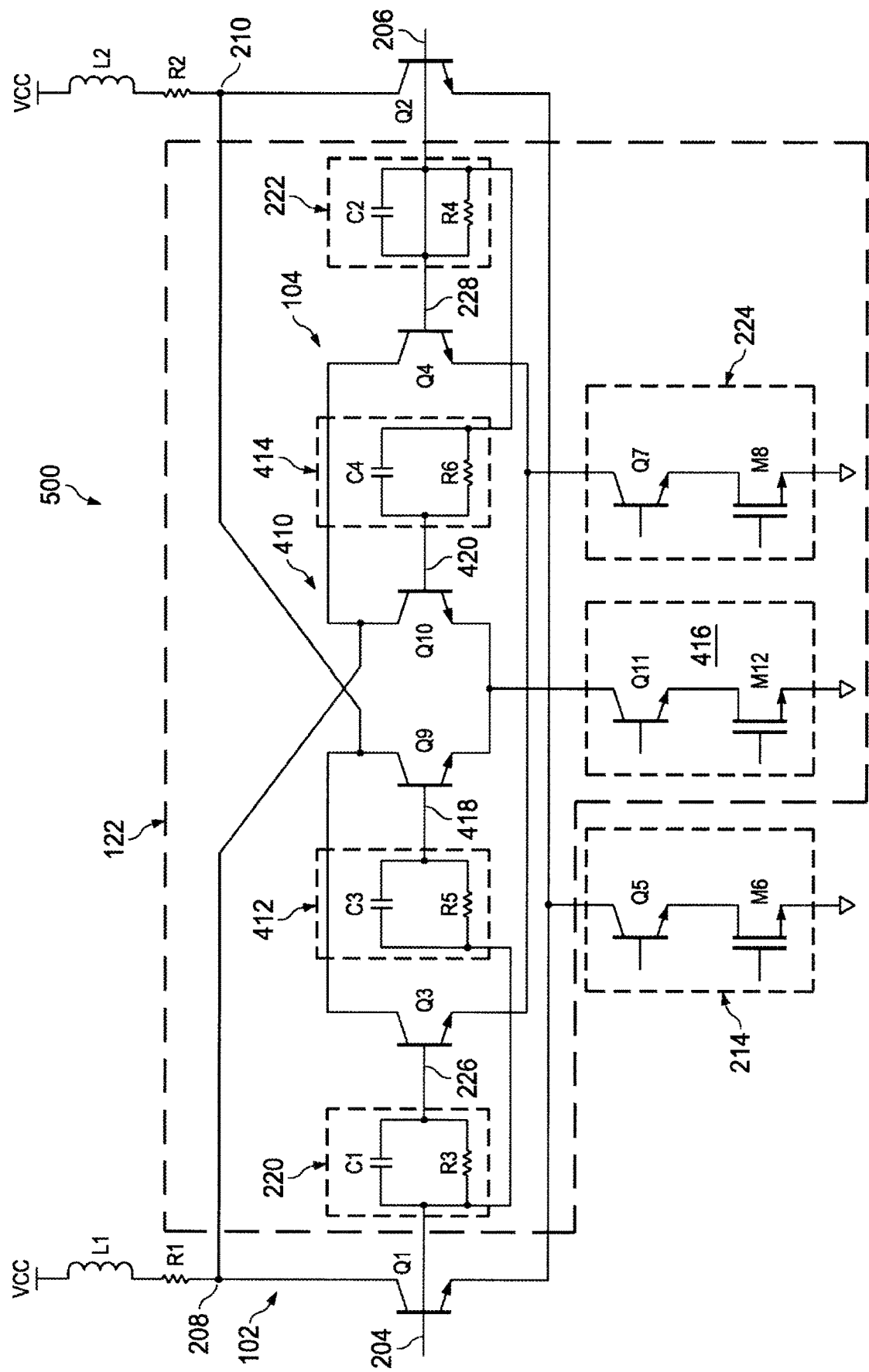
FIG. 5 is a circuit diagram showing another example amplifier having distributed feedforward cancellation.
Figure 6:
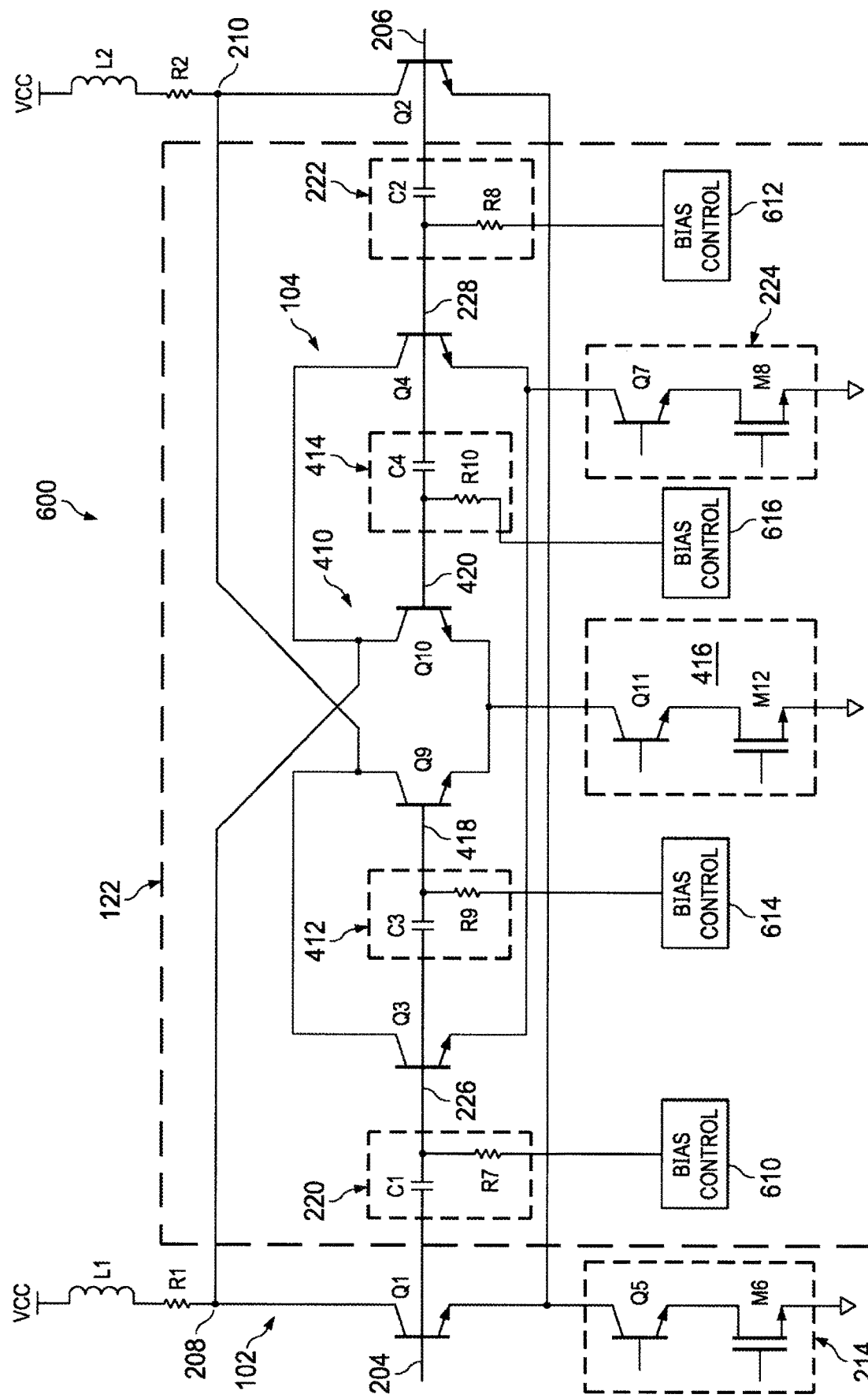
FIG. 6 is a circuit diagram showing another example amplifier having feedforward cancellation with bias controls.

FIGS. 4, 5, and 6 shows different example embodiments of amplifier circuits configured to implement distributed feedforward cancellation for respective frequency bands. In each of the examples of FIGS. 4, 5, and 6, the main amplifier 102 is the same as shown in FIG. 2. Accordingly, the description of FIGS. 4, 5, and 6 also refers to the description of FIG. 2.

Referring to FIG. 4, an amplifier circuit 400 thus includes a main amplifier 102 and feedforward cancellation circuitry 122. The feedforward cancellation circuitry 122 includes multiple instances of a feedforward cancellation amplifier circuit, each cascaded together and configured to implement distortion cancellation at one or more respective frequency bands. In the example of FIG. 4, a first feedforward cancellation circuit includes a differential feedforward amplifier 104, filters 220 and 222, and a bias circuit 224. As described with respect to FIG. 2, the filter 220 is coupled between the input 226 of feedforward amplifier 104 and the input 204 of the main amplifier. Similarly, filter 222 is coupled between the input 228 of feedforward amplifier 104 and the input 206 of the main amplifier 102.

The feedforward cancellation circuitry 122 includes another instance of a feedforward cancellation amplifier circuit, which includes a second differential amplifier 410, filters 412 and 414 and a bias circuit 416. For example, the differential amplifier 410 has inputs 418 and 420 coupled to respective inputs 204 and 206 of the main amplifier 202. In the example of FIG. 4, filters 220 and 412 are coupled in series between inputs 204 and 418, and filters 222 and 414 are coupled in series between the inputs 420 and 206. Also, the filter 412 is coupled between the inputs 226 and 418, and filter 414 is coupled between inputs 420 and 228. Outputs of the differential amplifier 410 are cross-coupled to respective outputs 208 and 210 of the main amplifier. For example, the differential amplifier 410 includes BJTs Q9 and Q10, in which the base of Q9 is the input 418 and the base of Q10 is the input 420. The collector of Q9 is coupled to output 210 and the collector of Q10 is coupled to output 208. The respective emitters of Q9 and Q10 are coupled together (e.g., common emitter configuration), and the bias circuit 416 is coupled to the respective emitters of Q9 and Q10 (e.g., configured as a tail current source). The bias circuit 416 includes a BJT Q11 coupled in series with MOSFET M12 between the emitters of Q9 and Q10 and ground.

In the example of FIG. 4, each of the filters 412 and 414 are shown as RC networks, including respective resistors R5 and R6 and capacitors C3 and C4. For example, R5=R6 and C3=C4. The filters 220, 222, 412 and 414 are not limited to RC networks (e.g., high-pass filters), but can be implemented by other types of filters configured to pass one or more desired frequency bands. The respective filters 220, 222, 412 and 414 can be configured according to frequency range of the main broadband amplifier, which can dictate the number of feedforward amplifiers and respective frequency responses of feedforward amplifier circuits implemented in the feedforward cancellation circuitry 122. The example of FIG. 4 includes two feedforward differential amplifiers 104 and 410. In another example, the circuit 400 includes more or fewer than two feedforward amplifier circuits.

As shown in the example of FIG. 4, the filters 412 and 220 are coupled in series between inputs 204 and 418, and filters 222 and 414 are coupled in series between inputs 420 and 206. Because respective filters 412 and 220 are coupled in series, the input 226 is configured to receive a different set of frequencies (or frequency bands) than the input 418. Likewise, the input 228 is configured to receive a different set of frequencies (or frequency bands) than the input 420.

As a further example, low frequency signals are progressively attenuated by the respective resistors R3, R4, R5 and R6, and thus are not applied to the inputs 418, 420, 226 and 228 of respective feedforward amplifiers 410 and 104. In another example, filters 220 and 222 are configured to pass both high and intermediate frequency signals to the inputs 226 and 228. The filters 412 and 414 are configured to pass high frequency signals to the inputs 418 and 420, and to block the intermediate frequency signals from reaching the inputs 418 and 420. This is controlled by setting the respective high pass filter pole frequencies by changing the values of the resistors and capacitors. For example, each of the filters 220, 222 has a pole at an intermediate frequency and the pole of each filter 412, 414 is at a higher frequency. As a result of such configuration, the transistors Q3 an Q4 act on both intermediate and high frequencies, and the transistors Q9 and Q10 of the amplifier 410 act at high frequencies only. Thus, frequencies (or frequency bands) of signals passed to the inputs 418 and 420 are seen by both feedforward amplifiers 410 and 104 to enhance linearity of such frequencies. Because the feedforward amplifiers 104 and 410 are driven with different sets of frequency signals (or frequency bands) and are biased for operation by respective bias circuits 224 and 416, the respective amplifiers 104 and 410 are configured to provide distortion cancellation signals to the outputs 208 and 210 distributed over respective frequency ranges. As a result, intermodulation distortion can be reduced at the amplifier outputs 208 and 210 over a wide frequency range to improve broadband linearity of the circuit 400.

Similar to circuits 100 and 200, the circuit 400 can be implemented on a semiconductor substrate of an IC. For example, the IC includes the main amplifier 102, the main bias circuit 110 as well as the cancellation circuitry 122. The load L1, R1, L2, R2 can be implemented on the IC or, alternatively, the load L1, R1, L2, R2 could be an external (off chip) load. Additionally, the source configured to supply VCC can be implemented either on chip (e.g., an internal supply) or off chip (e.g., an external supply).

FIG. 5 depicts an example of an amplifier circuit 500 that includes another example of the feedforward cancellation circuitry 122. The circuit 500 is similar to the configuration of the circuit 400 of FIG. 4. Accordingly, the description of FIG. 5 also refers to FIGS. 2 and 4. Briefly, the circuit 500 includes main amplifier 102 and multiple feedforward amplifiers 104 and 410. The feedforward amplifier 104 is a differential amplifier having respective inputs 226, 228 coupled to the inputs 204 and 206 of the main amplifier 102. Similarly, the feedforward amplifier 410 is a differential amplifier having respective inputs 418, 420 coupled to the inputs 204 and 206 of the main amplifier 102. The outputs of the differential feedforward amplifiers 104 and 410 are cross coupled to respective outputs 208, 210 of the main amplifier 102.

In the example of FIG. 5, filters 220 and 412 as well as filters 222 and 414 are not coupled in series as in the circuit 400 of FIG. 4. Instead, the filters 220, 222, 412 and 414 are coupled directly to respective inputs 204 and 206 of the main amplifier 102. As a result, the filters 220 and 412 receive the same input signal, and the filters 222 and 414 receive the same input signal. The filter 412 thus is configured to filter the signal at 204 and provide a filtered signal at input 418 to drive part of the differential amplifier 410. The filter 414 is likewise configured to filter the signal at 206 to provide a filtered signal at input 420 to drive another part of the differential amplifier 410. Similarly, filters 220 and 222 are configured to filter the signals at inputs 204 and 206 and provide filtered signals at respective inputs 226 and 228 to drive the differential amplifier 104. Conceptually, the amplifier circuit 500 functions the same as the circuit 400. This configuration allows each of the filters 220, 222, 412 and 414 to be configured to pass one or more frequency bands to enable respective feedforward amplifiers 104 and 410 to operate in the respective bands responsive directly to the broadband signals applied at inputs 204 and 206. Additionally, as described with respect to the circuit 400, the circuit 500 can be implemented on a semiconductor substrate of an IC.

FIG. 6 depicts an example of an amplifier circuit 600 that includes another example of the feedforward cancellation circuitry 122. The circuit 500 is similar to the configuration of the circuit 400 of FIG. 4. Accordingly, the description of FIG. 6 also refers to FIGS. 2 and 4. Briefly, the circuit 600 includes main amplifier 102 and multiple feedforward amplifiers 104 and 410. The feedforward amplifier 104 is a differential amplifier having respective inputs 226, 228 coupled to the inputs 204 and 206 of the main amplifier 102. Similarly, the feedforward amplifier 410 is a differential amplifier having respective inputs 418, 420 coupled to the inputs 204 and 206 of the main amplifier 102. The outputs of the differential feedforward amplifiers 104 and 410 are cross coupled to respective outputs 208, 210 of the main amplifier 102.

Similar to the circuit 400 of FIG. 4, filter 412 is coupled between inputs 204 and 418, and filter 414 is coupled between inputs 420 and 206. Likewise, filter 220 is coupled between inputs 204 and 226, and filter 222 is coupled between inputs 206 and 228. In the example of FIG. 6, however, each of the filters 220, 222, 412 and 414 includes only respective capacitors C1, C2, C3 and C4. Because resistors have been omitted from respective filters 220, 222, 412 and 414, the filters are configured to block low frequency signals from passing to the respective inputs of the feedforward amplifiers. The low frequency signals are thus only provided to respective inputs 204, 206 for amplification by the main amplifier 102. The capacitors C1, C2, C3 and C4 can be configured as high pass filters. For example, capacitors C1 and C2 are configured (e.g., having a capacitance) to pass a signals within a first frequency band (e.g., above a first cutoff frequency) to inputs 226 and 228. Capacitors C3 and C4 are configured (e.g., having a capacitance) to pass signals within a second frequency band (e.g., above a second cutoff frequency) to the inputs 418 and 420. For example, the second frequency band is higher frequency than the first frequency band.

In another example, as shown in FIG. 6, the base of transistors Q3, Q4, Q9 and Q10 are coupled to bias control circuits 610, 612, 614 and 616 through respective resistors R7, R8, R9 and R10. The bias control circuits 610, 612, 614 and 616 are configured to independently bias the bases of transistors Q3, Q4, Q9 and Q10, such as to provide additional functionality. In an example, the same bias control circuit can be implemented to control the transistors Q3 and Q4 for operating the differential feedforward amplifier 104, and another bias control circuit is configured to control transistors Q9 and Q10 for operating the differential feedforward amplifier 410. For example, the bias control circuits can be configured to provide the bias applied to the bases of transistors Q3, Q4, Q9 and Q10 so the amplifiers 104 and 410 are configured to generate the same or about the same distortion as the main amplifier 102, while operating in different frequency bands. The independent bias control to set the base voltages of the feedforward amplifiers 104 and 410 provides an additional degree of freedom in controlling the distortion generated by the amplifiers. As described herein, the circuit 600 can be implemented on a semiconductor substrate of an IC. In an example, the IC also includes independent bias control circuits 610, 612, 614 and 616. Additionally, independent bias control circuits can be used to operate respective transistors of feedforward amplifiers in other example amplifier circuits, including circuits 200, 400 and 500 described herein, to provide additional freedom to control the respective cancellation amplifiers for achieving desired wideband distortion cancellation.

In this description, the term "couple" or "coupled" means either an indirect or direct wired or wireless connection. For example, if a first device, element, or component couples to a second device, element, or component, that coupling may be through a direct coupling or through an indirect coupling via other devices, elements, or components and connections. Similarly, a device, element, or component that is coupled between a first component or location and a second component or location may be through a direct connection or through an indirect connection via other devices, elements, or components and/or couplings. A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Furthermore, a circuit or device that is described herein as including certain components may instead be configured to couple to those components to form the described circuitry or device. For example, a structure described as including one or more semiconductor elements (such as transistors), one or more passive elements (such as resistors, capacitors, inductors, and/or transmission line), and/or one or more sources (such as voltage and/or current sources) may instead include only the semiconductor elements within a single physical device (e.g., a semiconductor die and/or IC package) and may be configured to couple to at least some of the passive elements and/or the sources to form the described structure either at a time of manufacture or after a time of manufacture, such as by an end-user and/or a third-party.

Components illustrated as resistors, unless otherwise stated, are generally representative of any one or more elements coupled in series and/or parallel to provide an amount of impedance represented by the illustrated resistor. For example, a resistor or capacitor illustrated and described herein as a single component may instead be multiple resistors or capacitors, respectively, coupled in parallel between the same nodes. As another example, a resistor or capacitor illustrated and described herein as a single component may instead be multiple resistors or capacitors, respectively, coupled in series between the same two nodes as the single resistor or capacitor.

Modifications are possible in the described embodiments, and other embodiments are possible, within the scope of the claims.

What is claimed is:

1. A circuit comprising:
    a main amplifier having a first input and a first output;
    a main bias circuit coupled to the main amplifier, the main bias circuit configured to operate the main amplifier in a first frequency band;
    a first feedforward cancellation amplifier having a second input and a second output, the second input coupled to the first input, and the second output coupled to the first output;
    a first filter coupled between the first input and the second input;
    a feedforward bias circuit coupled to the first feedforward cancellation amplifier, the feedforward bias circuit configured to operate the first feedforward cancellation amplifier in a second frequency band within and narrower than the first frequency band;
    a second feedforward cancellation amplifier having a third input and a third output, the third input coupled to the first input, and the third output coupled to the first output; and
    a second filter coupled between the first input and the third input, the second filter configured to implement a transfer function different from a transfer function of the first filter.

2. The circuit of claim 1, wherein the first filter includes at least one of a resistor, a capacitor, an inductor and a transmission line.

3. The circuit of claim 1, wherein a bandwidth of the first filter is configurable to control a frequency range of a filtered signal provided to the second input.

4. The circuit of claim 1, wherein the second filter is coupled in series with the first filter between the first input and the third input.

5. The circuit of claim 1, wherein
    the first filter has a first filter input and a first filter output, in which the first filter input is coupled to the first input of the main amplifier, and the first filter output is coupled to the second input of the first feedforward cancellation amplifier; and
    the second filter has a second filter input and a second filter output, in which the second filter input is coupled to the first input of the main amplifier, and the second filter output is coupled to the third input of the second feedforward cancellation amplifier.

6. The circuit of claim 1, wherein the main amplifier includes a single differential broadband amplifier, and each of the first and second feedforward cancellation amplifiers include respective differential amplifiers having respective differential outputs, and the respective differential outputs of the first and second feedforward cancellation amplifiers are cross-coupled to respective differential outputs of the main amplifier.

7. The circuit of claim 1, wherein the first feedforward cancellation amplifier includes a control input coupled to a bias control circuit input.

8. The circuit of claim 1, wherein the main amplifier and the first feedforward cancellation amplifier include respective transistors, in which transistors of the first feedforward cancellation amplifier have a size less than or equal to 25% of a size of transistors of the main amplifier.

9. The circuit of claim 1 implemented on a semiconductor substrate of an integrated circuit.

10. A circuit comprising:
    a main differential amplifier having a first differential input and a first differential output;
    a feedforward cancellation circuit including:
        a first differential feedforward amplifier having a second differential input and a second differential output, wherein the second differential input is coupled to the first differential input, the second differential output is cross coupled to the first differential output, and the first differential feedforward amplifier is configured to reduce intermodulation distortion at the first differential output in a first frequency band; and
        a second differential feedforward amplifier having a third differential input and a third differential output, wherein the third differential input is coupled to the first differential input, the third differential output is cross coupled to the first differential output, and the second differential feedforward amplifier is configured to reduce intermodulation distortion at the first differential output in a second frequency band that is different from the first frequency band.

11. The circuit of claim 10, further comprising:
a first filter coupled between a first terminal of the first differential input and a first terminal of the second differential input; and
a second filter coupled between a second terminal of the first differential input and a second terminal of the second differential input, wherein the first and second filters are configured to pass signals in at least the first frequency band.

12. The circuit of claim 11, wherein at least one of the first and second filters is configurable to set the first frequency band.

13. The circuit of claim 11, wherein the first and second filters include respective filters, each respective filter including at least one of a resistor, a capacitor, an inductor and a transmission line.

14. The circuit of claim 11, further comprising:
a third filter coupled between the first terminal of the first differential input and a first terminal of the third differential input; and
a fourth filter coupled between the second terminal of the first differential input and a second terminal of the third differential input, the third and fourth filters configured to pass signals in at least the second frequency band.

15. The circuit of claim 14, further comprising:
a main feedforward bias circuit coupled to the main differential amplifier, wherein the main feedforward bias circuit is configured to bias the main differential amplifier for operation in a third frequency band that includes the first and second frequency bands;
a first feedforward bias circuit coupled to the first differential feedforward amplifier, wherein the first feedforward bias circuit is configured to bias the first differential feedforward amplifier to operate in the first frequency band; and
a second feedforward bias circuit coupled to the second differential feedforward amplifier, wherein the second feedforward bias circuit is configured to bias the second differential feedforward amplifier to operate in the second frequency band.

16. The circuit of claim 14, wherein
the first and third filters are coupled in series between the first terminal of the first differential input of the main differential amplifier and the first terminal of the third differential input of the second differential feedforward amplifier, and
the second and fourth filters are coupled in series between the second terminal of the first differential input of the main differential amplifier and the second terminal of the third differential input of the second differential feedforward amplifier.

17. The circuit of claim 10, wherein the main differential amplifier and each of the first and second differential feedforward amplifiers include transistors, wherein the transistors of the first differential feedforward amplifier are configured to consume less power than the main differential amplifier.

18. The circuit of claim 17, wherein the transistors of the first and second differential feedforward amplifiers each include a control input coupled to a respective bias control circuit input.

19. The circuit of claim 10 implemented on a semiconductor substrate of an integrated circuit.

20. An integrated circuit comprising:
a main broadband non-linear amplifier having a first input and a first output;
a first feedforward non-linear amplifier having a second input and a second output, in which the second input is coupled to the first input and the second output is coupled to the first output;
a first filter coupled between the first and second inputs;
a second feedforward non-linear amplifier having a third input and a third output, in which the third input is coupled to the first input and the third output is coupled to the first output; and
a second filter coupled between the first and third inputs.

21. The integrated circuit of claim 20, further comprising:
a main bias circuit coupled to the main broadband non-linear amplifier, wherein the main bias circuit is configured to operate the main broadband non-linear amplifier in a first frequency range;
a first bias circuit coupled to the first feedforward non-linear amplifier, wherein the first bias circuit is configured to operate the first feedforward non-linear amplifier in a second frequency range; and
a second bias circuit coupled to the second feedforward non-linear amplifier, wherein the second bias circuit is configured to operate the main broadband non-linear amplifier in a third frequency range, and each of the second and third frequency ranges are within the first frequency range.

22. The integrated circuit of claim 20, wherein each of the main broadband non-linear amplifier, the first feedforward non-linear amplifier and the second feedforward non-linear amplifier is a differential amplifier having respective differential inputs and differential outputs, wherein the differential outputs of the first and second feedforward non-linear amplifiers are cross-coupled to respective differential outputs of the main broadband non-linear amplifier.

* * * * *